United States Patent
Dao et al.

(10) Patent No.: US 7,924,108 B2
(45) Date of Patent: Apr. 12, 2011

(54) OSCILLATOR AMPLIFIER WITH INPUT CLOCK DETECTION AND METHOD THEREFOR

(75) Inventors: Chris C. Dao, Pflugerville, TX (US);
Stefano Pietri, Austin, TX (US);
Wenzhong Zhang, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 76 days.

(21) Appl. No.: 12/541,704

(22) Filed: Aug. 14, 2009

(65) Prior Publication Data
US 2011/0037524 A1 Feb. 17, 2011

(51) Int. Cl.
*H03B 5/32* (2006.01)
(52) U.S. Cl. .............. 331/158; 331/116 R; 331/116 FE; 331/74; 331/135
(58) Field of Classification Search .................. 331/158, 331/116 R, 116 FE, 74, 135
See application file for complete search history.

(56) References Cited

U.S. PATENT DOCUMENTS

| | | | |
|---|---|---|---|
| 4,370,625 A * | 1/1983 | Someshwar | 331/49 |
| 4,583,013 A | 4/1986 | Gupta | |
| 4,982,116 A | 1/1991 | Lee | |
| 5,369,377 A | 11/1994 | Benhamida | |
| 6,819,196 B2 * | 11/2004 | Lovelace et al. | 331/183 |
| 6,900,701 B2 | 5/2005 | Chan | |
| 7,411,467 B2 | 8/2008 | Alford | |
| 2001/0029589 A1 | 10/2001 | Takai | |

* cited by examiner

*Primary Examiner* — Arnold Kinkead
(74) *Attorney, Agent, or Firm* — Joanna G. Chiu; Robert L. King

(57) ABSTRACT

An oscillator circuit has a crystal oscillator amplifier having only two clock input terminals, one being an input terminal and the other being an output terminal. The input terminal allows a user of the integrated circuit to choose between connecting a first clock signal generated from a crystal or a second clock signal generated by a non-crystal source to the input terminal. Control circuitry has a capacitor coupled in parallel with a transistor. Both are coupled in series with a resistive device at an output of the control circuitry to provide a control signal. Clock generation circuitry coupled to the crystal oscillator amplifier provides an oscillating output signal in response to an enable signal. In one form a comparator circuit provides the oscillating output signal. The control signal is used to ensure that inputs to the comparator circuit repeatedly cross each other over time.

20 Claims, 3 Drawing Sheets

OSCILLATOR AMPLIFIER WITH INPUT CLOCK DETECTION AND METHOD THEREFOR

BACKGROUND

1. Field

This disclosure relates generally to an oscillator circuit, and more specifically, to an oscillator amplifier with input clock detection.

2. Related Art

Oscillator circuits are typically used to generate clock signals for use within an integrated circuit. An oscillator circuit may include a crystal oscillator amplifier which uses a crystal as an external source. In this case, the crystal oscillator amplifier receives an input signal from the crystal and provides an output signal that is out of phase with respect to the input signal. The input and output signals can then be used to produce a clock signal. However, in such some situations, rather than using a crystal as the external source, users of the oscillator amplifier circuit may use an external source other than a crystal from which to produce the clock signal. In doing so, the oscillator amplifier may no longer operate correctly or reliably, thus resulting in an incorrect or unreliable clock signal.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
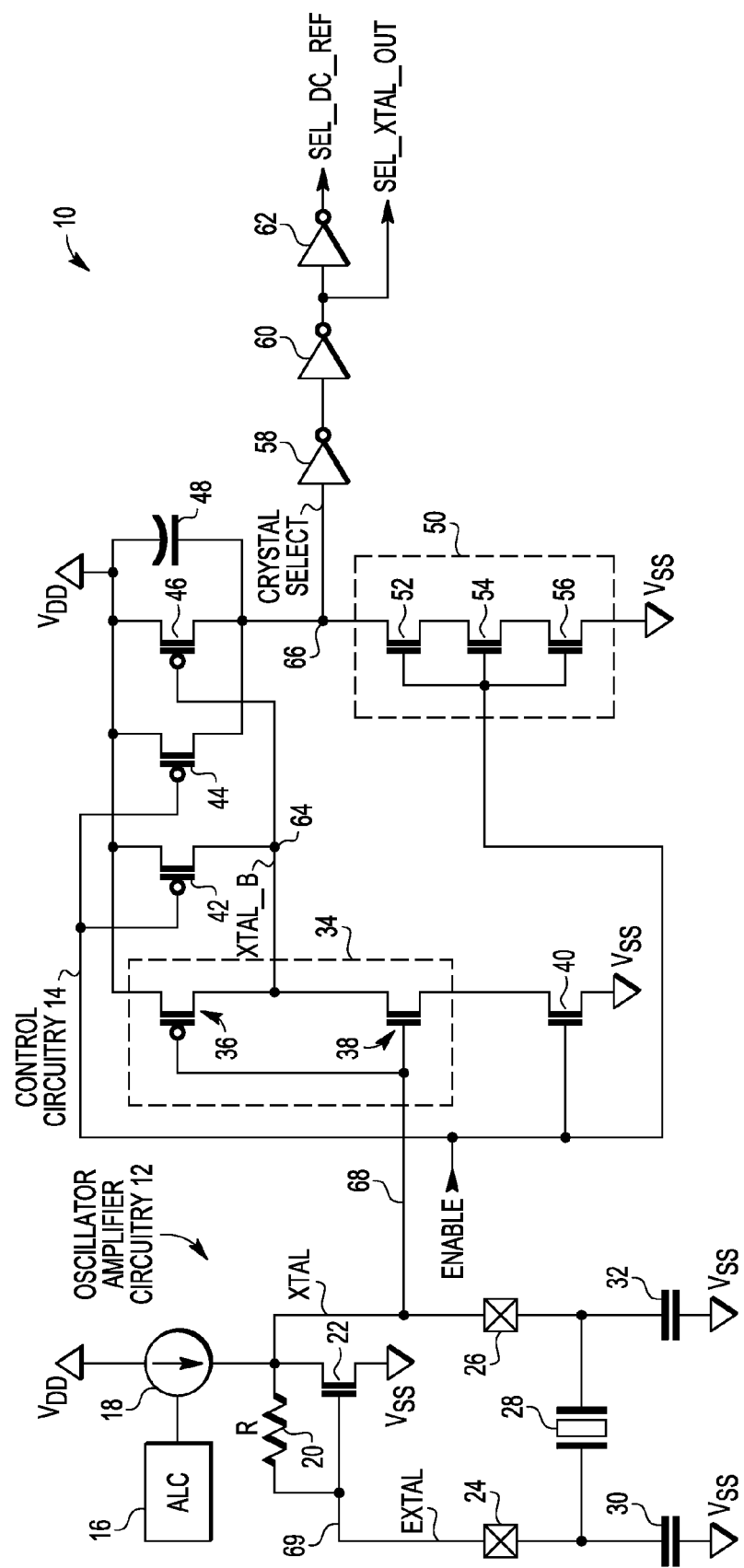
FIG. 1 illustrates, in partial block diagram and partial schematic form, oscillator circuitry in accordance with an embodiment of the present invention.

In one embodiment, oscillation circuitry implemented within an integrated circuit is used to produce a clock signal which may be used by a system implemented within the integrated circuit. The oscillation circuitry includes a crystal oscillator amplifier circuit which is coupled to an input terminal of the integrated circuit to receive an input signal, EXTAL. The crystal oscillator amplifier circuit, through the use of an automatic level control (ALC) and a current source, produces an output signal, XTAL. When a crystal is coupled to the input terminal, each of EXTAL and XTAL are oscillating signals and are 180 degrees out of phase with each other. A comparator can then be used to compare EXTAL and XTAL to properly generate an output clock since EXTAL and XTAL are guaranteed to repeatedly cross each other over time. In one embodiment, though, the input terminal is capable of receiving either a crystal or a non-crystal source. That is, a user of the integrated circuit is permitted to couple either a crystal to the input terminal or to couple a non-crystal source (such as, for example, a rail to rail square wave) to the same input terminal. The system is therefore capable of operating in crystal mode or external reference mode, based upon the source coupled to the input terminal of the oscillator amplifier circuitry. When a non-crystal source is coupled to the input terminal, XTAL may be driven to ground due to the ALC of the crystal oscillator amplifier. In this case, XTAL is no longer an oscillating signal and is not guaranteed to cross EXTAL, and thus, the comparison of XTAL to EXTAL may no longer produce a correct or reliable clock signal. Therefore, in the case of a non-crystal source, EXTAL may need to be compared to a different reference signal (rather than XTAL) in order to correctly and reliably produce a clock signal.

Furthermore, when the system is first powered up or booted, it is unknown what source is coupled to the input terminal. In one embodiment, the default of the oscillation circuitry is set to crystal mode, such that oscillation circuitry assumes that upon power up or boot up a crystal is coupled to the input terminal of the crystal oscillator amplifier. This default setting allows for the proper generation of a clock signal so long as, in fact, a crystal is coupled to the input terminal. However, a problem may arise when, upon power up or boot up, a non-crystal source (such as, for example, a rail to rail square wave) is coupled to the input terminal.

Therefore, in one embodiment, control circuitry within the oscillation circuitry is able to select an appropriate reference signal with which to compare EXTAL in order to produce a reliable clock, regardless of what source the user decides to couple to the input terminal of the crystal oscillator amplifier. In one embodiment, the control circuitry selects XTAL as the reference signal for comparison with EXTAL when a crystal is coupled to the input terminal, and selects a predetermined direct current (DC) reference as the reference signal when a non-crystal source is coupled to the input terminal. In another embodiment, the oscillation circuitry selects the inverse of EXTAL as the reference signal when a non-crystal source is coupled to the input terminal. In yet other embodiments, other predetermined reference signals may be selected when a non-crystal source is coupled to the input terminal.

In another embodiment, the control circuitry disables the ALC in order to set the gain of the oscillator amplifier to a fixed value when a non-crystal source is coupled to the input terminal of the oscillator amplifier circuitry. In this manner, with the ALC disabled, XTAL will not be driven to ground, even if a rail to rail signal is received at the input terminal. In this case, both EXTAL and XTAL will be oscillating signals and will be 180 degrees out of phase with each other. Therefore, again, a comparator can be used to compare EXTAL and XTAL to properly generate an output clock since EXTAL and XTAL are guaranteed to repeatedly cross each other over time. In this embodiment, when a crystal source is coupled to the input terminal, the ALC may not disabled such that it can properly control the amplitude of the signal generated by the crystal.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

FIG. 1 illustrates an oscillator circuit 10 (also referred to as oscillation circuitry) which includes oscillator amplifier circuitry 12 (also referred to as an oscillator amplifier) and control circuitry 14. Oscillator amplifier circuitry 12 includes a current source 18, an automatic level controller 16, a resistive element 20, an NMOS transistor 22 (where an NMOS transistor may also be referred to as an N-type transistor), a clock input terminal 24, and a clock output terminal 26. In one embodiment, oscillator amplifier circuitry 12 only includes two clock terminals (clock input terminal 24 and clock output terminal 26) where, in one embodiment, input terminal 24 receives an input from external the integrated circuit that includes oscillator amplifier circuitry 12 and output terminal 26 provides an output external to the integrated circuit that includes oscillator amplifier circuitry 12. A first terminal of current source 18 is coupled to a first power supply terminal to receive a first power supply (e.g. VDD), and a second terminal of current source 18 is coupled to a first terminal of resistive element 20 and a first current electrode of transistor 22. A control input of current source 18 is coupled to an output of ALC 16. A second terminal of resistive element 20 and a control electrode of transistor 22 are both coupled to a circuit node 69. Circuit node 69 is coupled to clock input terminal 24 and receives the oscillator amplifier input EXTAL. A second current electrode of transistor 22 is coupled to a second power supply terminal to receive a second power supply (e.g. VSS). The first current electrode of transistor 22, the first terminal of resistive element 20, and the second terminal of current source 18 are all coupled to a circuit node 68 and to clock output terminal 26. Circuit node 68 provides the oscillator amplifier output XTAL.

Control circuitry 14 includes inverter 34, PMOS transistors 42, 44, and 46 (where a PMOS transistor may also be referred to as a P-type transistor), NMOS transistor 40, capacitor 48, and a pull down circuit 50. An input of control circuitry 14 is coupled to circuit node 68. A first output of control circuitry 14 (at an output of inverter 60) provides a first control signal, SEL_XTAL_OUT, and a second output of control circuitry 14 (at an output of inverter 62) provides a second control signal, SEL_DC_REF. Circuit node 68 is coupled to an input of inverter 34 and an output of inverter 34 is coupled to circuit node 64 and provides XTAL_B at circuit node 64. Inverter 34 includes a PMOS transistor 36 (where a PMOS transistor may also be referred to as a P-type transistor) and an NMOS transistor 38. A first current electrode of transistor 36 is coupled to the first supply voltage terminal (to receive VDD), a second current electrode of transistor 36 is coupled to circuit node 64, and a control electrode of transistor 36 is coupled to circuit node 68. A first current electrode of transistor 38 is coupled to circuit node 64, a control electrode of transistor 38 is coupled to circuit node 68, and a second current electrode of transistor 38 is coupled to a first current electrode of transistor 40. A control electrode of transistor 40 is coupled to receive an enable signal, and a second current electrode of transistor 40 is coupled to the second supply voltage terminal (to receive VSS). A control electrode of each of transistors 42 and 44 receives the enable signal. A first current electrode of transistor 42 is coupled to the first supply voltage terminal, and a first current electrode of transistor 44 is coupled to the first supply voltage terminal. A second current electrode of transistor 42 is coupled to circuit node 64, and a second current electrode of transistor 44 is coupled to a circuit node 66 (which provides a control signal, CRYSTAL SELECT). A first current electrode of transistor 46 is coupled to the first supply voltage terminal (VDD), a second current electrode of transistor 46 is coupled to circuit node 66, and a control electrode of transistor 46 is coupled to circuit node 64. Capacitor 48 is coupled in parallel with transistor 46 and has a first terminal coupled to the first supply voltage terminal (VDD) and a second terminal coupled to circuit node 66.

Capacitor 48 and transistor 46 are coupled in series with pull down circuit 50. In the illustrated embodiment, pull down circuit 50 includes an NMOS transistor 52, an NMOS transistor 54, and an NMOS transistor 56. A first current electrode of transistor 52 is coupled to circuit node 66, a second current electrode of transistor 52 is coupled to a first current electrode of transistor 54, a second current electrode of transistor 54 is coupled to a first current electrode of transistor 56, and a second current electrode of transistor 56 is coupled to the second supply voltage terminal (VSS). A control electrode of each of transistors 52, 54, and 56 is coupled to receive the enable signal. In an alternate embodiment, pull down circuit 50 may include only one transistor or may include any number of series connected transistors. In an alternate embodiment, pull down circuit 50 is implemented with a resistive element. Circuit node 66 is coupled to an input of inverter 58, an output of inverter 58 is coupled to an input of inverter 60, and the output of inverter 60 is coupled to an input of inverter 62.

Figure 2:
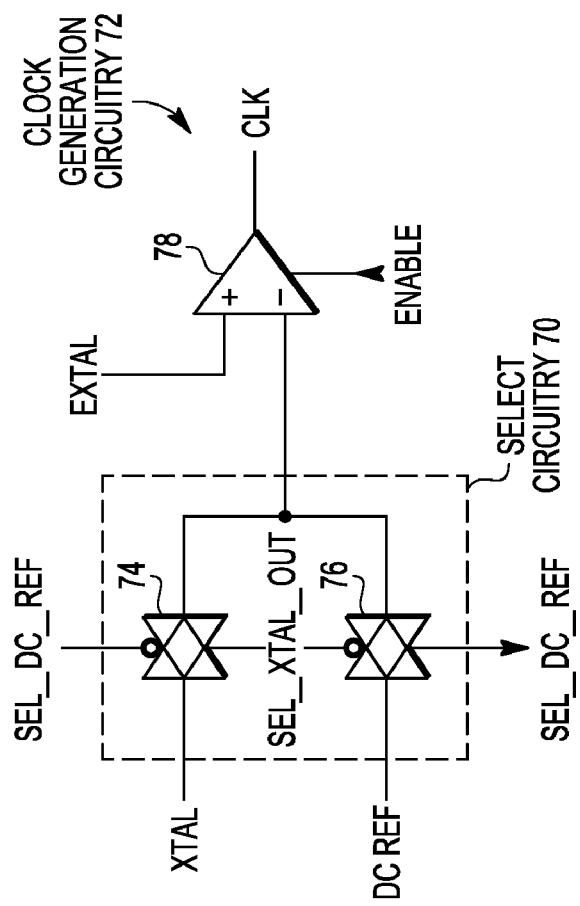
FIG. 2 illustrates, in schematic form, clock generation circuitry which may be used with the oscillator circuitry of FIG. 1, in accordance with an embodiment of the present invention.

FIG. 2 illustrates clock generation circuitry 72 which includes select circuitry 70 and a comparator 78. Comparator 78 receives EXTAL at a first input (e.g. a positive input), and comparator 78 receive an output of select circuitry 70 at a second input (e.g. a negative input). Comparator 78 also receives the enable signal at a control input and provides a clock signal, CLK, at an output. (Note that the clock signal may also be referred to as an oscillating output signal, and is output in response to the enable signal.) Select circuitry includes pass gates 74 and 76. A data input of pass gate 74 is coupled to receive XTAL, and a data output of pass gate 74 is coupled to the second input of comparator 78. A first control input of pass gate 74 (corresponding, for example, to a control electrode of a PMOS transistor of pass gate 74) is coupled to receive SEL_DC_REF, a second control input of pass gate 74 (corresponding, for example, to a control electrode of an NMOS transistor of pass gate 74) is coupled to receive SEL_XTAL_OUT. A data input of pass gate 76 is coupled to receive a reference signal, such as a DC reference (DC REF), and a data output of pass gate 76 is coupled to the second input of comparator 78. A first control input of pass gate 76 (corresponding, for example, to a control electrode of a PMOS transistor of pass gate 76) is coupled to receive SEL_XTAL_OUT, a second control input of pass gate 76 (corresponding, for example, to a control electrode of an NMOS transistor of pass gate 76) is coupled to receive SEL_DC_REF. Note that SEL_XTAL_OUT and SEL_DC_REF can each be considered phase shifted versions of CRYSTAL SELECT 66 (through the use, for example, of inverters 58, 60, and 62). Alternate embodiments may generate the control signals, SEL_XTAL_OUT and SEL_DC_REF, differently from CRYSTAL SELECT. In one embodiment, select circuitry 70 may be referred to as a multiplexer having a first input coupled to receive XTAL, a second input coupled to receive a reference signal (such as DC REF or an inverted version of EXTAL), an output coupled to the second input of comparator 78, and a control terminal for receiving one or more control signals (such as CRYSTAL SELECT, or phase shifted versions of CRYSTAL SELECT such as SEL_XTAL_OUT and SEL_DC_REF).

In one embodiment, clock generation circuitry 72 may be considered a part of oscillator circuit 10. In one embodiment, all of oscillator circuit 10 is located on a same integrated circuit, where, in one embodiment, the integrated circuit may refer to a packaged or an unpackaged die or may be part of a multiple die package. In one embodiment, clock terminals 24 and 26 may be referred to as integrated circuit terminals which allow communication with elements external to the integrated circuit. In one embodiment, the clock output of comparator 78 is used by a system located on a same integrated circuit as oscillator circuit 10 or as clock generation circuitry 72.

Referring to FIG. 1, in operation, the input signal, EXTAL, is received from terminal 24 and provided to oscillator amplifier circuitry 12. Oscillator amplifier circuitry 12 selectively amplifies EXTAL to produce the output signal, XTAL, which is 180 degrees out of phase with respect to EXTAL. XTAL is provided, via circuit node 68, to control circuitry 14. When crystal 28 is coupled to clock terminals 24 and 26, the first terminal of crystal 28 is coupled to input terminal 24 and XTAL is also provided to the second terminal of crystal 28 via output terminal 26. In this case, EXTAL and XTAL have amplitudes controlled by ALC 16 via current source 18, and a comparison of EXTAL to XTAL (which are 180 degrees out of phase with each other) is performed to produce a clock signal, as known in the art, through the use of a comparator. However, when a non-crystal source is provided to input terminal 24 (such as, for example, a rail to rail square wave), ALC 16, in an attempt to control the amplitudes of EXTAL and XTAL, may drive XTAL to ground, or to a low DC level that is too low for EXTAL and XTAL to cross each other repeatedly over time. In this case, XTAL would no longer be an oscillating signal (as was the case when crystal 28 was coupled to terminals 24 and 26). (Note that in the case of a non-crystal source, terminal 26 is left floating, such that XTAL can properly be provided to control circuitry 14.) Therefore, if a comparator is used to compare EXTAL to XTAL, no output clock would be produced, or the output clock would be unreliable since XTAL is no longer an oscillating signal which is 180 degrees out of phase with EXTAL and is at a voltage level that does not allow it to cross EXTAL sufficiently (exceeding a hysteresis level of the comparator) for the comparator to generate a clock. In this case, an output clock could be reliably produced if EXTAL were compared to a known DC reference rather than XTAL or to another predetermined signal which is guaranteed to repeatedly cross EXTAL over time. Therefore, in one embodiment, control circuitry 14, based on XTAL, controls whether EXTAL is compared to XTAL or to a different reference signal to produce the output clock, CLK.

As illustrated in FIG. 1, control circuitry 14 is coupled to node 68 to receive XTAL and provides output control signals SEL_XTAL_OUT and SEL_DC_OUT. These control signals may be used by clock generation circuitry 72 (as will be described below in reference to FIG. 2) to properly select a reference signal with which to compare EXTAL to generate an output clock. Control circuitry 14 also receives an enable signal which enables or disables control circuitry 14. In one embodiment, the enable signal is the same enable signal which enables/disables oscillation circuitry 10. In an alternate embodiment, it may be a signal which only enables/disables control circuitry 14. When enable is asserted (i.e. a logic level one), transistors 40, 52, 54, and 56 are on, and transistors 42 and 44 are off. Therefore, control circuitry 14 operates with inverter 34, transistor 46, capacitor 48, and pull down circuit 50 to generate SEL_XTAL_OUT and SEL_D-C_OUT when enabled.

Operation of control circuitry 14, with the enable signal asserted, will first be described in reference to a non-crystal source being coupled to terminal 24 (where terminal 26 is left floating). Inverter 34 within control circuitry 14 receives XTAL and provides the inverse of XTAL, XTAL_B, to the control electrode of transistor 46. In the case of a non-crystal source, such as a rail to rail square wave, ALC 16 will drive XTAL to ground or to a low DC level. Therefore, XTAL_B at the output of inverter 34 will be a logic level 1. Note that any non-crystal source with an amplitude large enough to cause ALC 16 to drive XTAL to ground or to a low DC level will result in XTAL_B going to a logic level 1. When XTAL_B is a logic level 1, transistor 46 is off. Therefore, node 66 is pulled down by pull down circuit 50, which, in one embodiment, is implemented with one or more weak NMOS devices. Since node 66 is pulled low (to a logic level 0), the output of inverter 58 becomes a logic level 1, the output of inverter 60 (i.e. SEL_XTAL_OUT) becomes a logic level 0, and the output of inverter 62 (i.e. SEL_DC_REF) becomes a logic level 1. Therefore, note that SEL_DC_REF is asserted and SEL_X-TAL_OUT is deasserted such that a DC reference, rather than XTAL, is selected for comparison with EXTAL. Use of the signals SEL_DC_REF and SEL_XTAL_OUT to generate a clock signal will be described below in reference to FIG. 2.

Operation of control circuitry 14, with the enable signal asserted, will now be described in reference to crystal 28 being coupled to terminals 24 and 26. Inverter 34 within control circuitry 14 receives XTAL and provides the inverse of XTAL, XTAL_B, to the control electrode of transistor 46. In the case of a crystal source, XTAL is an oscillating signal whose amplitude is controlled by ALC 16 via current source 18. Therefore, XTAL_B at the output of inverter 34 is also an oscillating signal. Transistor 46 is therefore alternately turned on and off by XTAL_B. During the times when transistor 46 is on, capacitor 48 is charged, and when transistor 46 is off, capacitor 48 is discharged. In the illustrated embodiment, capacitor 48 is maintained primarily discharged. In one embodiment, the Resistor-Capacitor (RC) time constant of capacitor 48 and pull down circuit 50 is designed such that it is greater than a period of XTAL. With capacitor 48 discharged, the voltage drop over capacitor 48 is zero or close to zero and thus node 66 goes to a logic level 1. Since node 66 is a logic level 1, the output of inverter 58 becomes a logic level 0, the output of inverter 60 (i.e. SEL_XTAL_OUT) becomes a logic level 1, and the output of inverter 62 (i.e. SEL_D-C_REF) becomes a logic level 0. Therefore, note that SEL_DC_REF is deasserted and SEL_XTAL_OUT is asserted such that XTAL is selected as the reference signal for comparison with EXTAL.

Referring now to FIG. 2, comparator 78 compares EXTAL (at the first input of comparator 78) with a reference signal (at the second input of comparator 78) where the reference signal can either be XTAL or DC REF, based on the control signals SEL_XTAL_OUT and SEL_DC_REF. For example, select circuitry 70 may implement a multiplexer which, when SEL_DC_REF is asserted and SEL_XTAL_OUT is deasserted (indicating a non-crystal source at input terminal 24), provides DC REF, via pass gate 76, to the second input of comparator 78 for comparison with EXTAL. When SEL_D-C_REF is deasserted and SEL_XTAL_OUT is asserted (indicating a crystal such as crystal 28 is coupled to input terminal 24), select circuitry 70 provides XTAL, via pass gate 74, to the second input of comparator 78 for comparison with EXTAL.

In one embodiment, DC REF is an internally generated DC voltage which may be produced, for example, by a voltage divider that is coupled to VDD, such that DC REF is approximately VDD/2. In another embodiment, DC REF may be replaced with an inverted version of EXTAL (in which EXTAL may be provided, via an inverter, to the data input of pass gate 76). Alternatively, other reference signals may be provided to the second input of comparator 78 when SEL_DC_REF is asserted, indicating a non-crystal source is coupled to terminal 24. In one embodiment, control signals SEL_DC_REF and SEL_XTAL_OUT are generated (in response to CRYSTAL SELECT at node 66) by control circuitry 14 to ensure that the inputs of comparator 78 repeatedly cross each other over time. That is, the control signals are used to select an appropriate reference voltage that is ensured to cross with EXTAL such that the clock signal, CLK, can be correctly and reliably produced.

Note that in one embodiment, comparator 78 may be implemented as an amplifier. Alternatively, other embodiments may implement comparator 78 with or without hysteresis using other circuitry.

Referring back to FIG. 1, when the enable signal is deasserted (i.e. a logic level zero), transistor 40 is off and transistors 42 and 44 are on. In this case, circuit node 64 is coupled to the first supply voltage terminal (VDD) via transistor 42. This ensures that transistor 46 is off. Circuit Node 66 is coupled to the first supply voltage terminal (VDD) via transistor 44. Therefore, in this case, SEL_XTAL_OUT is asserted and SEL_DC_REF is deasserted. However, note that the control input of comparator 78 receives the enable signal such that, when the enable signal is asserted, comparator 78 is enabled and operates as discussed above to generate CLK. However, when deasserted, comparator 78 is disabled and does not output a clock. Therefore, comparator 78 provides an oscillating output signal (CLK) in response to the enable signal.

Note that, as described above, a user is permitted to couple either a crystal source or a non-crystal source to input terminal 24. That is, a same input terminal of oscillator amplifier circuitry 12 can be coupled to either a crystal source or a non-crystal source, as was described above. In this manner, oscillator amplifier circuitry 12 may be implemented with only two clock terminals (e.g. input terminal 24 and output terminal 26) while still allowing a user to select between a crystal source and a non-crystal source. That is, a third clock terminal is not needed for oscillator circuitry 10 to allow a user to use either a crystal source or a non-crystal source. Therefore, by needing only two clock terminals to handle either a non-crystal or a crystal source, pin count may be saved which in turn may reduce circuit size and cost.

Figure 3:
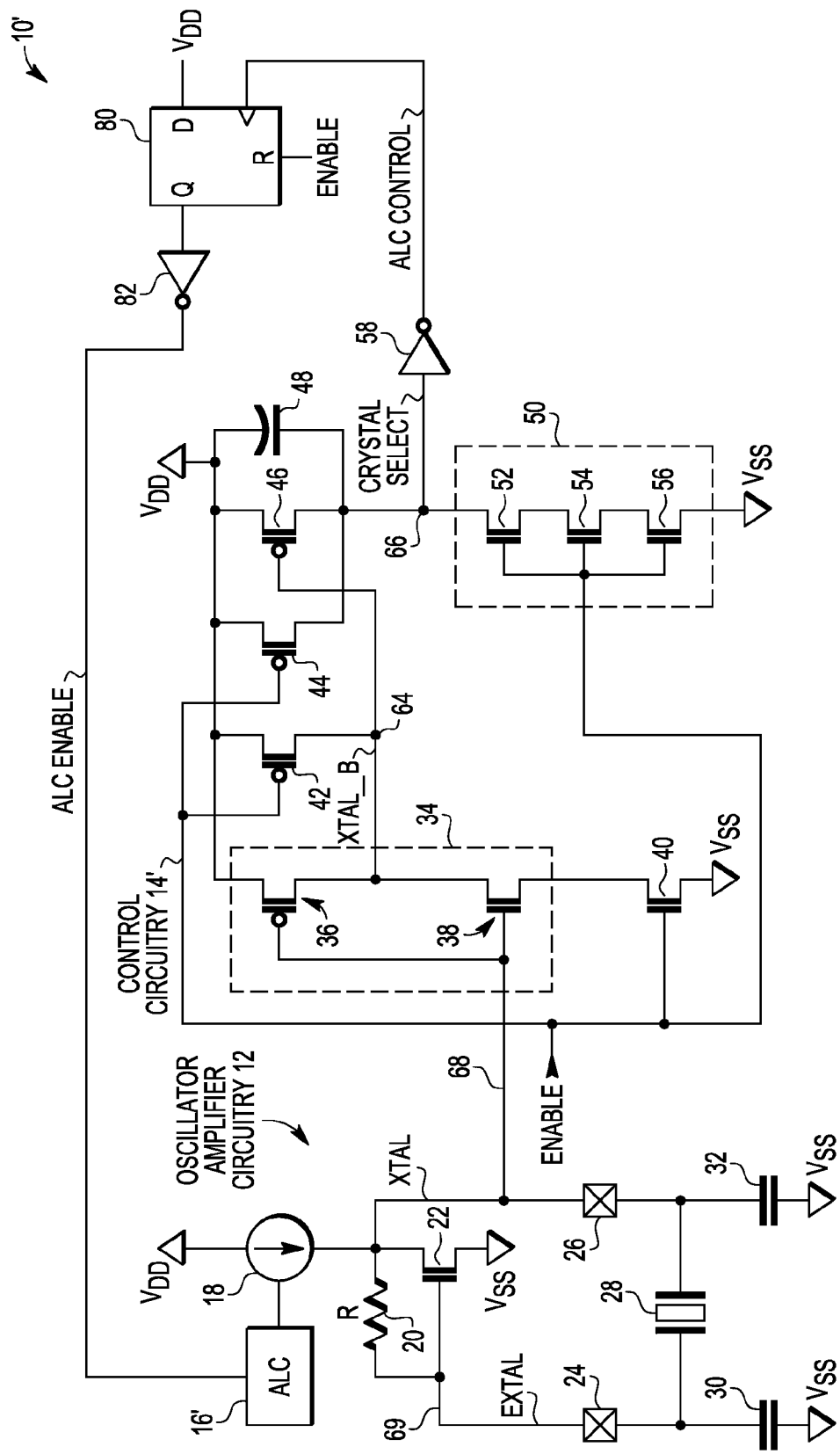
FIG. 3 illustrates, in partial block diagram and partial schematic form, oscillator circuitry in accordance with an embodiment of the present invention.

FIG. 3 illustrates an oscillator circuit 10' in accordance with one embodiment of the present invention. Note that much of oscillator circuit 10' is the same as oscillator circuit 10 in which like numbers refer to like elements. Therefore, the description of those like elements is the same as described above and, for simplicity, will not be described again in reference to FIG. 3. For example, operation of inverter 34, transistors 40, 42, 44, and 46, capacitor 48, and pull down circuit 50 remains as described above in reference to FIG. 1. The discussions below with respect to operation of oscillator circuit 10' assume that the enable signal is asserted. Also, the discussions provided above with respect to comparator 78 and the CLK output of comparator 78 also apply to comparator 86 and the CLK output of comparator 86, with the second inputs of each of comparators 78 and 86 being different.

As discussed above, if a non-crystal source is coupled to terminal 24 and ALC 16' were enabled, ALC 16' would drive XTAL down to ground or to a low DC level. Therefore, in one embodiment, the output of inverter 58 (ALC CONTROL) is used to control ALC 16'. In one embodiment, it is used to generate an ALC enable signal. In one embodiment, when the ALC enable signal is deasserted, ALC 16' is disabled such that it modifies and controls the gain of oscillator amplifier circuitry 12 to set the gain to a fixed value. When the ALC enable signal is asserted, ALC 16' operates to modify the amplitude of EXTAL and XTAL via current source 18 as known in the art.

As illustrated in FIG. 3, control circuitry 14' does not include inverters 60 and 62 of control circuitry 14, and includes a latch 80 and an inverter 82. In the illustrated embodiment, latch 80 is implemented with a D flip flop in which the output of inverter 58, ALC CONTROL, is provided to the clock input of the D flip flop, the first supply voltage terminal (VDD) is provided to the data input (D input) of the D flip flop, the data output (Q output) of the D flip flop is provided to the input of inverter 82, and the enable signal is provided to the reset input of the D flip flop. The output of inverter 82 is provided as the ALC enable signal to ALC 16'. Therefore, when the enable signal is asserted (such as on power up or upon reset), the Q output of latch 80 is reset to a logic level 0. Therefore, the output of inverter 82 is a logic level 1. Therefore, in response to ALC enable being asserted (a logic level 1), ALC 16' is enabled to control the amplitude of EXTAL and XTAL. If a crystal source is coupled to terminal 24, node 66 becomes a logic level 1 (as was described above in reference to control circuitry 14). Therefore, ALC CONTROL remains at a logic level 0, thus providing no rising edge to the clock input of latch 80. Therefore, the Q output of a logic level 0 is maintained.

However, if a non-crystal source is coupled to terminal 24, node 66 becomes a logic level 0 (as was described above in reference to control circuitry 14). In this case, ALC CONTROL becomes a logic level 1, thus providing a rising clock edge to the clock input of latch 80. Therefore, a logic level 1 (provided by VDD to the D input) is latched into latch 80. The Q output becomes a logic level 1, and the ALC ENABLE is deasserted (to a logic level j). Therefore, in response to ALC ENABLE being deasserted, ALC 16' is disabled by setting the gain of oscillator amplifier circuitry 12 to be a constant value. At this point, even though a non-crystal source (such as a rail to rail oscillating signal) is coupled to terminal 24, XTAL becomes an oscillating signal that is 180 degrees out of phase with EXTAL because ALC 16' is disabled. With XTAL being an oscillating signal, XTAL_B also oscillates, and, as described above, node 66, due to the discharge of capacitor 48, becomes a logic level 1. However, this does not affect the value of ALC ENABLE because a rising clock edge is not again provided to the clock input of latch 80. Therefore, latch 80 is used to properly store the appropriate value of ALC CONTROL. Also, note that latch 80 and inverter 82 provides a feedback circuit which is coupled between an output of control circuitry 14' (such as the output of inverter 58) and oscillator amplifier circuitry 12 for disabling ALC 16' in response to a level transition of circuit node 66 to implement a predetermined constant gain of oscillator amplifier 12.

Figure 4:
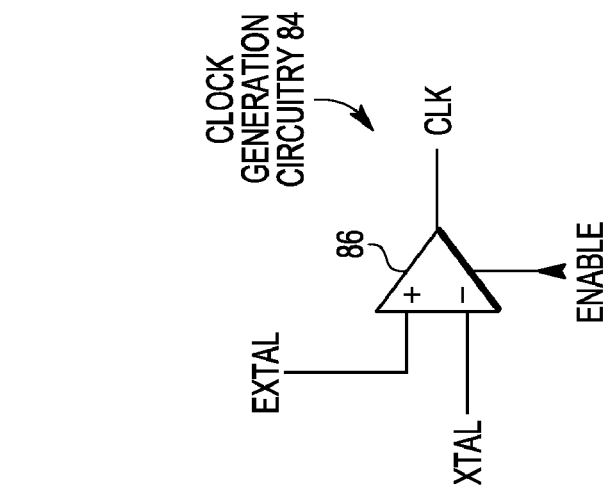
FIG. 4 illustrates, in schematic form, clock generation circuitry which may be used with the oscillator circuitry of FIG. 3, in accordance with an embodiment of the present invention.

FIG. 4 illustrates clock generation circuitry 84 which includes a comparator 86 which compares EXTAL to XTAL. That is, because ALC 16' is disabled in the case of a non-crystal source (that has a sufficiently large amplitude to cause circuit node 68 to be initially driven to ground or a low DC level), XTAL is an oscillating signal that is guaranteed to repeatedly cross EXTAL over time. Therefore, comparator 86 can reliably compare EXTAL to XTAL to produce a reliable clock signal, CLK.

Therefore, by now it should be appreciated how control circuitry 14 and 14' produce control signals which allow for the generation of a reliable clock. Note that control circuitry 14 and 14' allow for the ALC (16 or 16') to be bypassed by either changing the reference signal that is used by the comparator which produces the clock signal, CLK, or by disabling ALC 16'. In the embodiments described herein, control circuitry 14 and 14' generates one or more control signals (e.g. ALC ENABLE, SEL_XTAL_OUT, or SEL_DC_REF) which ensure that inputs to the comparator circuit repeatedly cross each other over time. For example, control circuitry 14 does this through the generation of SEL_XTAL_OUT and SEL_DC_REF (generated in response to CRYSTAL SELECT at node 66) which selects between XTAL (an output of oscillator amplifier 12) and a predetermined reference signal (such as DC REF or an inverse of EXTAL, which is an input of oscillator amplifier 12). Control circuitry 14' does this by modifying and controlling the gain of ALC 16' to control a value of XTAL (the output of oscillator amplifier 12). For example, CRYSTAL SELECT at node 66 is used to control the current biasing (by ALC 16' and current source 18) to control a gain of oscillator amplifier circuitry 12. In this manner, the reference signal used for comparison with EXTAL by either comparator 78 or 86 is ensured to repeatedly cross with EXTAL over time such that a reliable clock signal, CLK, can be produced. Also, in one embodiment, the clock generated by comparator 78 or 86 can be referred to as a boot clock and used during a boot sequence of a system. For example, this may be useful in the case, as described above, in which it is unknown what type of source (a crystal or a non-crystal source) is coupled to input terminal 24 until the boot sequence completes.

Although the invention has been described with respect to specific conductivity types or polarity of potentials, skilled artisans appreciated that conductivity types and polarities of potentials may be reversed. For example, rather pull down circuit 50, the polarities may be reversed, such that a pull up circuit may be used in series with a transistor and capacitor, such as transistor 46 and capacitor 48, that are coupled in parallel with each other and to the second supply voltage terminal (e.g. VSS). It can be appreciated that other circuit changes may be necessary to properly reverse the polarities of control circuitry 14.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. For example, polarities may be reversed, different circuitries may be used to implement circuitry 50, different circuitries may be used to implement comparators 78 and 86, etc. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes an oscillator circuit implemented in an integrated circuit having a crystal oscillator amplifier having only two clock terminals, one of the only two clock terminals being an input terminal and the other being an output terminal, the input terminal allowing a user of the integrated circuit to choose between connecting a first clock signal generated from a crystal or a second clock signal generated by a non-crystal source to the input terminal; control circuitry coupled to the output terminal of the crystal oscillator amplifier, the control circuitry comprising a capacitor coupled in parallel with a first transistor which are coupled in series with a resistive device at a node for providing a control signal; and clock generation circuitry coupled to the crystal oscillator amplifier for providing an oscillating output signal in response to an enable signal. Item 2 includes the oscillator circuit of item 1 wherein the control signal provided by the control circuitry is used to control the crystal oscillator amplifier by controlling current biasing in the crystal oscillator amplifier to control a gain of the crystal oscillator amplifier. Item 3 includes the oscillator circuit of item 1 wherein the control signal provided by the control circuitry is used to select either a signal generated by the crystal oscillator amplifier at the output terminal or a predetermined signal to be compared with an input signal provided to the input terminal of the crystal oscillator amplifier. Item 4 includes the oscillator circuit of item 3 wherein the predetermined signal is one of an inversion of the first or second clock signal or is a direct current reference signal. Item 5 includes the oscillator circuit of item 1 wherein the control circuitry further includes an inverter having an input coupled to the output terminal of the crystal oscillator amplifier and an output coupled to a control electrode of the first transistor; and enable circuitry coupled to the inverter, the first transistor, the capacitor and the resistive device for selectively enabling the control circuitry to operate. Item 6 includes the oscillator circuit of item 1 wherein the control circuitry further includes an inverter having an input coupled to the output of the crystal oscillator amplifier and an output, the inverter comprising a second transistor of a first conductivity type having a first current electrode coupled to a first power supply voltage terminal, a control electrode, and a second current electrode, and a third transistor of a second conductivity type having a first current electrode coupled to the second current electrode of the first transistor at the output of the inverter, a control electrode coupled to the control electrode of the second transistor at the input of the inverter, and a second current electrode; a fourth transistor of the second conductivity type having a first current electrode coupled to the second current electrode of the third transistor, a control electrode for receiving an enable signal, and a second current electrode coupled to a second power supply voltage terminal; a fifth transistor of the first conductivity type having a first current electrode coupled to the first power supply voltage terminal, a control electrode coupled to the enable signal, and a second current electrode coupled to the output of the inverter; and a sixth transistor of the first conductivity type having a first current electrode coupled to the first power supply voltage terminal, a control electrode coupled to the enable signal, and a second current electrode coupled to the node for providing the control signal, wherein the first transistor has a control electrode coupled to the output of the inverter and the first transistor and capacitor are coupled in parallel between the first power supply voltage terminal and the node for providing the control signal. Item 7 includes the oscillator circuit of item 1 wherein the clock generation circuitry further includes a multiplexor having a first input coupled to the output terminal of the crystal oscillator amplifier and a second input for receiving either an inversion of the first clock signal or a direct current reference signal, a control terminal for receiving the control signal provided by the control circuitry, and an output; and a comparator having a first input for receiving the first clock signal, a second input coupled to the output of the multiplexor, and an output for providing an output for providing the oscillating output signal. Item 8 includes the oscillator circuit of item 1 wherein the control circuitry further includes feedback circuitry coupled between the node for providing the control signal and the crystal oscillator amplifier for disabling automatic level control of the crystal oscillator amplifier in response to a level transition of the control signal to implement a predetermined constant gain of the crystal oscillator amplifier. Item 9 includes the oscillator circuit of item 1 wherein the resistive device further comprises a plurality of series-coupled transistors coupled between the node for providing the control signal and a voltage terminal, each transistor of the plurality of series-coupled transistors having a control electrode coupled together for receiving the enable signal. Item 10 includes the oscillator circuit of item 1 wherein an RC time constant of the capacitor and the resistive device is greater in value than a period of the first clock signal, and the RC time constant of the capacitor and the resistive device is greater in value than a period of the second clock signal.

Item 11 includes a method for providing an oscillating output signal in a circuit which includes providing a crystal oscillator amplifier having only two clock terminals which are respectively an input clock terminal and an output clock terminal, the input clock terminal for receiving either a first clock signal generated from a crystal or receiving a second clock signal generated by a non-crystal source; selectively amplifying with the crystal oscillator amplifier the first clock signal or the second clock signal to provide an amplified clock signal; using the amplified clock signal to generate a control signal; comparing with a comparator circuit either the first clock signal or the second clock signal with a third clock signal to provide the oscillating output signal; and using the control signal to ensure that signal inputs to the comparator circuit repeatedly cross each other over time. Item 12 includes the method of item 11 wherein the control signal is used to ensure that signal inputs to the comparator circuit repeatedly cross each other over time by using a value of the control signal to select between an output of the crystal oscillator amplifier and one of a reference signal or an inverse of an input of the crystal oscillator amplifier. Item 13 includes the method of item 11 wherein the control signal is used to ensure that signal inputs to the comparator circuit repeatedly cross each other over time by using a value of the control signal to modify and control gain of the crystal oscillator amplifier to control a value of the output terminal of the crystal oscillator amplifier.

Item 14 includes an oscillator circuit implemented in an integrated circuit having a crystal oscillator amplifier having only two clock terminals, one of the only two clock terminals being an input terminal and the other being an output terminal, the input terminal receiving either a first clock signal generated from a crystal or a second clock signal generated by a non-crystal source; control circuitry coupled to the output terminal of the crystal oscillator amplifier, the control circuitry comprising an inverter having an input coupled to the output terminal of the crystal oscillator amplifier and an output, a capacitor having a first terminal coupled to a first power supply voltage terminal and a second terminal coupled to an output node, a first transistor having a first current electrode coupled to the first power supply voltage terminal, a control electrode coupled to the output of the inverter, and a second current electrode coupled to the output node, and a resistive device coupled in series with the capacitor and first transistor between the output node and a second power supply voltage terminal, the control circuitry providing a control signal at the output node; and clock generation circuitry coupled to the crystal oscillator amplifier for providing an oscillating output signal in response to an enable signal. Item 15 includes the oscillator circuit of item 14 wherein the clock generation circuitry further includes a multiplexor having a first input coupled to the output terminal of the crystal oscillator amplifier and a second input for receiving either an inversion of the first clock signal or a direct current reference signal, a control terminal for receiving the control signal provided by the control circuitry, and an output; and a comparator having a first input for receiving the first clock signal, a second input coupled to the output of the multiplexor, and an output for providing the oscillating output signal. Item 16 includes the oscillator circuit of item 14 wherein the control circuitry further includes feedback circuitry coupled between the output node of the control circuitry and the crystal oscillator amplifier for disabling automatic level control of the crystal oscillator amplifier in response to a level transition of the control signal to implement a predetermined constant gain of the crystal oscillator amplifier. Item 17 includes the oscillator circuit of item 14 wherein an RC time constant of the capacitor and the resistive device is greater in value than a period of the first clock signal, and the RC time constant of the capacitor and the resistive device is greater in value than a period of the second clock signal. Item 18 includes the oscillator circuit of item 14 wherein the clock generation circuitry further includes a comparator having a first input for receiving one of the first clock signal or the second clock signal, a second input for receiving either an output from the output terminal of the crystal oscillator amplifier or one of a reference signal or an inverse of what the input terminal of the crystal oscillator amplifier receives, and an output for providing the oscillating output signal, wherein the control signal ensures that signal inputs to the comparator repeatedly cross each other over time. Item 19 includes the oscillator circuit of item 18 wherein the control signal is used to ensure that signal inputs to the comparator repeatedly cross each other over time by using the control signal as a select signal to control select circuitry for selecting between an output of the crystal oscillator amplifier and one of a reference signal or an inverse of either the first clock signal or the second clock signal. Item 20 includes the oscillator circuit of item 18 wherein the control signal is used to ensure that signal inputs to the comparator repeatedly cross each other over time by modifying and controlling gain of the crystal oscillator amplifier to control a value of an output at the output terminal of the crystal oscillator amplifier.

What is claimed is:

1. An oscillator circuit implemented in an integrated circuit, comprising:
a crystal oscillator amplifier having only two clock terminals, one of the only two clock terminals being an input terminal and the other being an output terminal, the input terminal allowing a user of the integrated circuit to choose between connecting a first clock signal generated from a crystal or a second clock signal generated by a non-crystal source to the input terminal;
control circuitry coupled to the output terminal of the crystal oscillator amplifier, the control circuitry comprising a capacitor coupled in parallel with a first transistor which are coupled in series with a resistive device at a node for providing a control signal; and
clock generation circuitry coupled to the crystal oscillator amplifier for providing an oscillating output signal in response to an enable signal.

2. The oscillator circuit of claim 1 wherein the control signal provided by the control circuitry is used to control the crystal oscillator amplifier by controlling current biasing in the crystal oscillator amplifier to control a gain of the crystal oscillator amplifier.

3. The oscillator circuit of claim 1 wherein the control signal provided by the control circuitry is used to select either a signal generated by the crystal oscillator amplifier at the output terminal or a predetermined signal to be compared with an input signal provided to the input terminal of the crystal oscillator amplifier.

4. The oscillator circuit of claim 3 wherein the predetermined signal is one of an inversion of the first or second clock signal or is a direct current reference signal.

5. The oscillator circuit of claim 1 wherein the control circuitry further comprises:
an inverter having an input coupled to the output terminal of the crystal oscillator amplifier and an output coupled to a control electrode of the first transistor; and
enable circuitry coupled to the inverter, the first transistor, the capacitor and the resistive device for selectively enabling the control circuitry to operate.

6. The oscillator circuit of claim 1 wherein the control circuitry further comprises:
an inverter having an input coupled to the output terminal of the crystal oscillator amplifier and an output, the inverter comprising a second transistor of a first conductivity type having a first current electrode coupled to a first power supply voltage terminal, a control electrode, and a second current electrode, and a third transistor of a second conductivity type having a first current electrode coupled to the second current electrode of the first transistor at the output of the inverter, a control electrode coupled to the control electrode of the second transistor at the input of the inverter, and a second current electrode;
a fourth transistor of the second conductivity type having a first current electrode coupled to the second current electrode of the third transistor, a control electrode for receiving an enable signal, and a second current electrode coupled to a second power supply voltage terminal;
a fifth transistor of the first conductivity type having a first current electrode coupled to the first power supply voltage terminal, a control electrode coupled to the enable signal, and a second current electrode coupled to the output of the inverter; and
a sixth transistor of the first conductivity type having a first current electrode coupled to the first power supply voltage terminal, a control electrode coupled to the enable signal, and a second current electrode coupled to the node for providing the control signal, wherein the first transistor has a control electrode coupled to the output of the inverter and the first transistor and capacitor are coupled in parallel between the first power supply voltage terminal and the node for providing the control signal.

7. The oscillator circuit of claim 1 wherein the clock generation circuitry further comprises:
a multiplexor having a first input coupled to the output terminal of the crystal oscillator amplifier and a second input for receiving either an inversion of the first clock signal or a direct current reference signal, a control terminal for receiving the control signal provided by the control circuitry, and an output; and
a comparator having a first input for receiving the first clock signal, a second input coupled to the output of the multiplexor, and an output for providing an output for providing the oscillating output signal.

8. The oscillator circuit of claim 1 wherein the control circuitry further comprises:
feedback circuitry coupled between the node for providing the control signal and the crystal oscillator amplifier for disabling automatic level control of the crystal oscillator amplifier in response to a level transition of the control signal to implement a predetermined constant gain of the crystal oscillator amplifier.

9. The oscillator circuit of claim 1 wherein the resistive device further comprises a plurality of series-coupled transistors coupled between the node for providing the control signal and a voltage terminal, each transistor of the plurality of series-coupled transistors having a control electrode coupled together for receiving the enable signal.

10. The oscillator circuit of claim 1 wherein an RC time constant of the capacitor and the resistive device is greater in value than a period of the first clock signal, and the RC time constant of the capacitor and the resistive device is greater in value than a period of the second clock signal.

11. A method for providing an oscillating output signal in a circuit, the method comprising:
providing a crystal oscillator amplifier having only two clock terminals which are respectively an input clock terminal and an output clock terminal, the input clock terminal for receiving either a first clock signal generated from a crystal or receiving a second clock signal generated by a non-crystal source;
selectively amplifying with the crystal oscillator amplifier the first clock signal or the second clock signal to provide an amplified clock signal;
using the amplified clock signal to generate a control signal;
comparing with a comparator circuit either the first clock signal or the second clock signal with a third clock signal to provide the oscillating output signal; and
using the control signal to ensure that signal inputs to the comparator circuit repeatedly cross each other over time.

12. The method of claim 11 wherein the control signal is used to ensure that signal inputs to the comparator circuit repeatedly cross each other over time by using a value of the control signal to select between an output of the crystal oscillator amplifier and one of a reference signal or an inverse of an input of the crystal oscillator amplifier.

13. The method of claim 11 wherein the control signal is used to ensure that signal inputs to the comparator circuit repeatedly cross each other over time by using a value of the control signal to modify and control gain of the crystal oscillator amplifier to control a value of the output terminal of the crystal oscillator amplifier.

14. An oscillator circuit implemented in an integrated circuit, comprising:
   a crystal oscillator amplifier having only two clock terminals, one of the only two clock terminals being an input terminal and the other being an output terminal, the input terminal receiving either a first clock signal generated from a crystal or a second clock signal generated by a non-crystal source;
   control circuitry coupled to the output terminal of the crystal oscillator amplifier, the control circuitry comprising an inverter having an input coupled to the output terminal of the crystal oscillator amplifier and an output, a capacitor having a first terminal coupled to a first power supply voltage terminal and a second terminal coupled to an output node, a first transistor having a first current electrode coupled to the first power supply voltage terminal, a control electrode coupled to the output of the inverter, and a second current electrode coupled to the output node, and a resistive device coupled in series with the capacitor and first transistor between the output node and a second power supply voltage terminal, the control circuitry providing a control signal at the output node; and
   clock generation circuitry coupled to the crystal oscillator amplifier for providing an oscillating output signal in response to an enable signal.

15. The oscillator circuit of claim 14 wherein the clock generation circuitry further comprises:
   a multiplexor having a first input coupled to the output terminal of the crystal oscillator amplifier and a second input for receiving either an inversion of the first clock signal or a direct current reference signal, a control terminal for receiving the control signal provided by the control circuitry, and an output; and
   a comparator having a first input for receiving the first clock signal, a second input coupled to the output of the multiplexor, and an output for providing the oscillating output signal.

16. The oscillator circuit of claim 14 wherein the control circuitry further comprises:
   feedback circuitry coupled between the output node of the control circuitry and the crystal oscillator amplifier for disabling automatic level control of the crystal oscillator amplifier in response to a level transition of the control signal to implement a predetermined constant gain of the crystal oscillator amplifier.

17. The oscillator circuit of claim 14 wherein an RC time constant of the capacitor and the resistive device is greater in value than a period of the first clock signal, and the RC time constant of the capacitor and the resistive device is greater in value than a period of the second clock signal.

18. The oscillator circuit of claim 14 wherein the clock generation circuitry further comprises:
   a comparator having a first input for receiving one of the first clock signal or the second clock signal, a second input for receiving either an output from the output terminal of the crystal oscillator amplifier or one of a reference signal or an inverse of what the input terminal of the crystal oscillator amplifier receives, and an output for providing the oscillating output signal, wherein the control signal ensures that signal inputs to the comparator repeatedly cross each other over time.

19. The oscillator circuit of claim 18 wherein the control signal is used to ensure that signal inputs to the comparator repeatedly cross each other over time by using the control signal as a select signal to control select circuitry for selecting between an output of the crystal oscillator amplifier and one of a reference signal or an inverse of either the first clock signal or the second clock signal.

20. The oscillator circuit of claim 18 wherein the control signal is used to ensure that signal inputs to the comparator repeatedly cross each other over time by modifying and controlling gain of the crystal oscillator amplifier to control a value of an output at the output terminal of the crystal oscillator amplifier.

* * * * *